(12) United States Patent
Sinquin et al.

(10) Patent No.: US 9,679,777 B2
(45) Date of Patent: Jun. 13, 2017

(54) PROCESS, STACK AND ASSEMBLY FOR SEPARATING A STRUCTURE FROM A SUBSTRATE BY ELECTROMAGNETIC RADIATION

(71) Applicant: Soitec, Bernin (FR)

(72) Inventors: Yann Sinquin, Grenoble (FR);
Jean-Marc Bethoux, La Buisse (FR);
Oleg Kononchuk, Theys (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/909,969

(22) PCT Filed: Aug. 5, 2014

(86) PCT No.: PCT/FR2014/052034
§ 371 (c)(1),
(2) Date: Feb. 3, 2016

(87) PCT Pub. No.: WO2015/019018
PCT Pub. Date: Feb. 12, 2015

(65) Prior Publication Data
US 2016/0189965 A1 Jun. 30, 2016

(30) Foreign Application Priority Data

Aug. 8, 2013 (FR) ...................... 13 01905

(51) Int. Cl.
*H01L 21/00* (2006.01)
*H01L 21/268* (2006.01)
(Continued)

(52) U.S. Cl.
CPC ........ *H01L 21/268* (2013.01); *H01L 21/7806* (2013.01); *H01L 29/20* (2013.01);
(Continued)

(58) Field of Classification Search
CPC ........................................................ H01L 21/00
See application file for complete search history.

(56) References Cited

U.S. PATENT DOCUMENTS

| 2002/0068201 | A1 | 6/2002 | Vaudo et al. |
| 2008/0099780 | A1 | 5/2008 | Tran |
| 2010/0255344 | A1 | 10/2010 | Kim et al. |

FOREIGN PATENT DOCUMENTS

| EP | 2290706 A2 | 3/2011 |
| KR | 20110130966 A | 12/2011 |

OTHER PUBLICATIONS

French Preliminary Search Report for French Application No. 1301905 dated Jun. 24, 2014, 2 pages.
(Continued)

*Primary Examiner* — Marvin Payen
(74) *Attorney, Agent, or Firm* — TraskBritt

(57) ABSTRACT

A method for separating a structure from a substrate through electromagnetic irradiations (EI) belonging to a spectral range comprises the steps of a) providing the substrate, b) forming an absorbent separation layer on the substrate, c) forming the structure to be separated on the separation layer, d) exposing the separation layer to the electromagnetic irradiations (EI) via the substrate such that the separation layer breaks down under the effect of the heat stemming from the absorption, the method being notable in that it comprises a step b1) of forming a transparent thermal barrier layer on the separation layer, the exposure period and the thickness of the thermal barrier layer being adapted such that the temperature of the structure to be separated remains below a threshold during the exposure period, beyond which threshold, faults are likely to appear in the structure.

20 Claims, 1 Drawing Sheet

(51) Int. Cl.
*H01L 31/0687* (2012.01)
*H01L 21/78* (2006.01)
*H01L 29/20* (2006.01)
*H01L 33/00* (2010.01)

(52) U.S. Cl.
CPC .... *H01L 29/2003* (2013.01); *H01L 31/06875* (2013.01); *H01L 33/0079* (2013.01)

(56) References Cited

OTHER PUBLICATIONS

International Search Report for International Application No. PCT/FR2014/052034 dated Oct. 22, 2014, 2 pages.
International Written Opinion for Internatioanl Application No. PCT/FR2014/052034 dated Oct. 22, 2014, 5 pages.

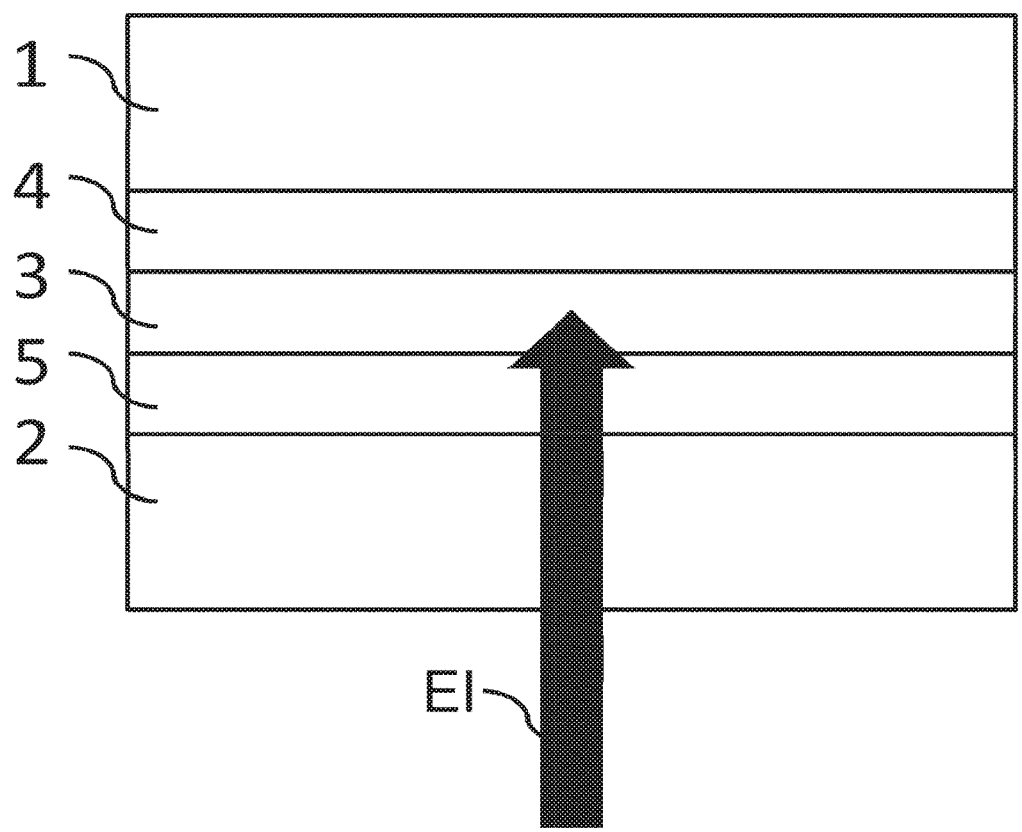

PROCESS, STACK AND ASSEMBLY FOR SEPARATING A STRUCTURE FROM A SUBSTRATE BY ELECTROMAGNETIC RADIATION

CROSS-REFERENCE TO RELATED APPLICATIONS

This application is a national phase entry under 35 U.S.C. §371 of International Patent Application PCT/FR2014/052034, filed Aug. 5, 2014, designating the United States of America and published as International Patent Publication WO 2015/019018 A1 on Feb. 12, 2015, which claims the benefit under Article 8 of the Patent Cooperation Treaty and under 35 U.S.C. §119(e) to French Patent Application Serial No. 13/01905, filed Aug. 8, 2013, the disclosure of each of which is hereby incorporated herein in its entirety by this reference.

TECHNICAL FIELD

This disclosure relates to a method for separating a structure from a substrate through electromagnetic irradiations, to a stack for separating a structure from a substrate through electromagnetic irradiations, and to a separation assembly.

BACKGROUND

A method for separating a structure from a substrate through electromagnetic irradiations belonging to a spectral range that is known from the prior art, notably from the U.S. Patent Application Publication US 2002/0068201 A1 (subsequently D1), comprises the steps of:
  a) providing the substrate, the substrate being transparent in the spectral range,
  b) forming at least one separation layer on the substrate, the spectral range of the electromagnetic irradiations being adapted such that the separation layer(s) are absorbent in the spectral range,
  c) forming the structure to be separated on the separation layer(s), and
  d) exposing the separation layer(s) to the electromagnetic irradiations via the substrate during an exposure period at a given power density such that the separation layer(s) break down under the effect of the heat stemming from the absorption of the electromagnetic irradiations.

The structure to be separated can be transferred to a final substrate following separation. The structure to be separated can comprise at least one active layer. "Active" is understood to mean a layer on which or in which there will be produced components that are intended for applications particularly in the field of microelectronics.

In D1, the structure to be separated is a layer produced from a material of (Al, Ga, In)N type. The substrate used in D1 is a substrate called a sacrificial template. D1 envisages one or more separation layers.

Such a separation method from the prior art is not entirely satisfactory insofar as the heat stemming from the absorption of the electromagnetic irradiations by the separation layer(s) is likely to greatly degrade the substrate and/or the structure to be separated, this being all the more so if the substrate and the structure to be separated have substantially different thermal expansion coefficients. This is the reason that the substrate used in D1 is a sacrificial substrate that cannot be recycled. Moreover, the degradation of the structure to be separated is likely to cause degradation of the active layer(s).

BRIEF SUMMARY

This disclosure aims to overcome all or some of the aforementioned disadvantages and concerns of a method for separating a structure from a substrate through electromagnetic irradiations belonging to a spectral range, the separation method comprising the steps of:
  a) providing the substrate, the substrate being transparent in the spectral range,
  b) forming at least one separation layer on the substrate, the spectral range of the electromagnetic irradiations being adapted such that the separation layer(s) are absorbent in the spectral range,
  c) forming the structure to be separated on the separation layer(s),
  d) exposing the separation layer(s) to the electromagnetic irradiations via the substrate during an exposure period at a given power density such that the separation layer(s) break down under the effect of the heat stemming from the absorption of the electromagnetic irradiations, the separation method being notable in that it has a step b1) of forming a thermal barrier layer on the separation layer(s), the spectral range of the electromagnetic irradiations being adapted such that the thermal barrier layer is transparent in the spectral range, the exposure period and the thickness of the thermal barrier layer being adapted such that the temperature of the structure to be separated remains below a threshold during the exposure period, beyond which threshold, faults are likely to appear in the structure, step c) being executed such that the structure to be separated is formed on the thermal barrier layer.

Thus, such a separation method according to the disclosure makes it possible to protect the structure to be separated from the heat stemming from the absorption of the electromagnetic irradiations by the separation layer(s) by means of the thermal barrier layer. The thermal barrier layer is transparent in the spectral range of the electromagnetic irradiations so as not to generate heat in proximity to the structure to be separated, which would be the case if the thermal barrier layer were absorbent in the spectral range of the electromagnetic irradiations. The thermal barrier layer has a thickness that is adapted to the exposure period so as to keep the temperature of the structure to be separated below a threshold. If the thickness of the thermal barrier layer is a fixed parameter, then the exposure period is adapted to the thickness so as to keep the temperature of the structure to be separated below a threshold.

According to one form of execution, the electromagnetic irradiations are electromagnetic pulses and the exposure period and the thickness of the thermal barrier layer, which is denoted $E_1$, confirm the following relationship: $E_1 \geq \sqrt{2D_1\tau}$; where $D_1$ is the thermal diffusion coefficient of the thermal barrier layer and $\tau$ is the duration of an electromagnetic pulse.

Thus, the thickness of the thermal barrier layer is greater than the length of thermal diffusion in the thermal barrier layer. It is preferable to choose a material for the thermal barrier layer and a duration for an electromagnetic pulse that are such that the length of thermal diffusion is short relative to the thickness of the thermal barrier layer so as best to confine the heat stemming from the absorption of the electromagnetic irradiations by the separation layer(s). This amounts to minimizing $D_1\tau$. Another advantage of low thermal diffusion is that it is possible to envisage a small thickness for the thermal barrier layer. This leads to a saving of execution time for the method, for example, when the thermal barrier layer is formed through epitaxy.

In one mode of implementation, the separation method comprises a step a1) of forming an additional thermal barrier layer on the substrate, the spectral range of the electromagnetic irradiations being adapted such that the additional thermal barrier layer is transparent in the spectral range, the exposure period and the thickness of the additional thermal barrier layer being adapted such that the temperature of the substrate remains below a threshold during the exposure period, beyond which threshold, faults are likely to appear in the substrate, and step b) is executed such that the separation layer(s) are formed on the additional thermal barrier layer.

Thus, such a separation method according to the disclosure makes it possible to protect the substrate from the heat stemming from the absorption of the electromagnetic irradiations by the separation layer(s) by means of the additional thermal barrier layer. It is, therefore, possible to recycle the substrate.

The additional thermal barrier layer is transparent in the spectral range of the electromagnetic irradiations so as:
  to authorize the exposure of the separation layer(s) to the electromagnetic irradiations, and
  not to generate heat in proximity to the substrate.

The additional thermal barrier layer has a thickness that is adapted to the exposure period so as to keep the temperature of the substrate below a threshold. If the thickness of the additional thermal barrier layer is a fixed parameter, then the exposure period is adapted to the thickness so as to keep the temperature of the substrate below a threshold.

According to one form of execution, the electromagnetic irradiations are electromagnetic pulses, and the exposure period and the thickness of the additional thermal barrier layer, which is denoted $E_2$, confirm the following relationship: $E_2 \geq \sqrt{2D_2\tau}$; where $D_2$ is the thermal diffusion coefficient of the additional thermal barrier layer and $\tau$ is the duration of an electromagnetic pulse.

Thus, the thickness of the additional thermal barrier layer is greater than the length of thermal diffusion in the additional thermal barrier layer. It is preferable to choose a material for the additional thermal barrier layer and a duration for an electromagnetic pulse that are such that the length of thermal diffusion is short relative to the thickness of the additional thermal barrier layer so as best to confine the heat stemming from the absorption of the electromagnetic irradiations by the separation layer(s). This amounts to minimizing $D_2\tau$. Another advantage of low thermal diffusion is that it is possible to envisage a small thickness for the additional thermal barrier layer. This leads to a saving of execution time for the method, for example, when the additional thermal barrier layer is formed through epitaxy.

In one mode of implementation, the thermal barrier layer and the additional thermal barrier layer each have a thermal diffusion coefficient, and the exposure period for the electromagnetic irradiations and the thermal diffusion coefficients are adapted such that the heat stemming from the absorption of the electromagnetic irradiations by the separation layer(s) is confined between the thermal barrier layer and the additional thermal barrier layer.

Thus, such confinement allows both an improvement in the breakdown of the separation layer(s) and protection of the structure to be separated and of the substrate.

In one mode of implementation, the additional thermal barrier layer is produced from a material having a lattice parameter that is between the lattice parameter of the substrate and the lattice parameter of the separation layer(s), steps a1) and b) preferably being executed through epitaxy.

Thus, the additional thermal barrier layer provides a supplementary buffer layer function for adapting the lattice parameters, this being so as to obtain an epitaxy with a minimum of faults.

In one mode of implementation, the thermal barrier layer is produced from a material having a lattice parameter that is between the lattice parameter of the structure to be separated and the lattice parameter of the separation layer(s), steps c) and d) preferably being executed through epitaxy.

Thus, the thermal barrier layer provides a supplementary buffer layer function for adapting the lattice parameters, this being so as to obtain an epitaxy with a minimum of faults.

According to one form of execution, the substrate comprises GaN, the separation layer(s) comprise $In_{(x)}Ga_{(1-x)}N$, $0.10 \leq x \leq 0.20$, preferably $0.12 \leq x \leq 0.15$, the thermal barrier layer and/or the additional thermal barrier layer comprises AlGaN, and the spectral range of the electromagnetic irradiations is between 400 and 450 nm.

According to another form of execution, the substrate comprises InP, the separation layer(s) comprise $In_{(x)}Ga_{(1-x)}$As, preferably $x<0.95$, more preferably $x=0.53$, the thermal barrier layer and/or the additional thermal barrier layer comprises InAlAs, preferably $In_{0.52}Al_{0.48}As$, and the spectral range of the electromagnetic irradiations is between 1000 and 3500 nm, preferably between 1100 and 1500 nm.

According to one feature, step d) is executed by means of at least one laser emitting the electromagnetic irradiations that is associated with an optical parametric oscillator.

Thus, such a laser associated with a parametric oscillator makes it possible to obtain electromagnetic irradiations covering a large spectral range, for example, from 400 nm to 2200 nm, which allows a large choice of materials for the separation layers.

This disclosure likewise relates to a stack for separating a structure from a substrate through electromagnetic irradiations belonging to a spectral range during an exposure period at a given power density, the separation stack comprising:
  a substrate, the substrate being transparent in the spectral range,
  at least one separation layer formed on the substrate, the separation layer(s) being absorbent in the spectral range, the separation layer(s) being likely to break down under the effect of the heat stemming from the absorption of the electromagnetic irradiations,
  the structure to be separated formed on the separation layer(s), the separation stack being notable in that it comprises a thermal barrier layer arranged between the separation layer(s) and the structure to be separated, the thermal barrier layer being transparent in the spectral range, the thermal barrier layer having a thickness that is adapted to the exposure period such that the temperature of the structure to be separated remains below a threshold during the exposure period, beyond which threshold, faults are likely to appear in the structure.

Thus, such a separation stack according to the disclosure makes it possible to protect the structure to be separated from the heat stemming from the absorption of the electromagnetic irradiations by the separation layer(s) by means of the thermal barrier layer. The thermal barrier layer is transparent in the spectral range of the electromagnetic irradiations so as not to generate heat in proximity to the structure to be separated, which would be the case if the thermal barrier layer were absorbent in the spectral range of the electromagnetic irradiations. The thermal barrier layer has a thickness that is adapted to the exposure period so as to keep the temperature of the structure to be separated below a threshold.

According to one form of execution, the electromagnetic irradiations are electromagnetic pulses, and the thickness of the thermal barrier layer, which is denoted $E_1$, confirms the following relationship: $E_1 \geq \sqrt{2D_1\tau}$; where $D_1$ is the thermal diffusion coefficient of the thermal barrier layer and T is the duration of an electromagnetic pulse.

Thus, the thickness of the thermal barrier layer is greater than the length of thermal diffusion in the thermal barrier layer. It is preferable to choose a material for the thermal barrier layer that is such that the length of thermal diffusion is short relative to the thickness of the thermal barrier layer so as to best confine the heat stemming from the absorption of the electromagnetic irradiations by the separation layer (s). This amounts to minimizing $D_1\tau$. Another advantage of low thermal diffusion is that it is possible to envisage a small thickness for the thermal barrier layer. This leads to a saving of execution time for the method, for example, when the thermal barrier layer is formed through epitaxy.

In one embodiment, the separation stack comprises an additional thermal barrier layer that is arranged between the separation layer(s) and the substrate, the additional barrier layer being transparent in the spectral range, the additional thermal barrier layer having a thickness that is adapted to the exposure period so that the temperature of the substrate remains below a threshold during the exposure period, beyond which threshold, faults are likely to appear in the substrate.

Thus, such a separation stack according to the disclosure makes it possible to protect the substrate from the heat stemming from the absorption of the electromagnetic irradiations by the separation layer(s) by means of the additional thermal barrier layer. It is, therefore, possible to recycle the substrate.

The additional thermal barrier layer is transparent in the spectral range of the electromagnetic irradiations so as:
to authorize the exposure of the separation layer(s) to the electromagnetic irradiations, and
not to generate heat in proximity to the substrate.

The additional thermal barrier layer has a thickness that is adapted to the exposure period so as to keep the temperature of the substrate below a threshold.

According to one form of execution, the electromagnetic irradiations are electromagnetic pulses, and the thickness of the additional thermal barrier layer, which is denoted $E_2$, confirms the following relationship: $E_2 \geq \sqrt{2D_2\tau}$; where $D_2$ is the thermal diffusion coefficient of the additional thermal barrier layer and $\tau$ is the duration of an electromagnetic pulse.

In one embodiment, the thermal barrier layer and the additional thermal barrier layer each have a thermal diffusion coefficient, and the thermal diffusion coefficients are adapted relative to the exposure period for the electromagnetic irradiations such that the heat stemming from the absorption of the electromagnetic irradiations by the separation layer(s) is confined between the thermal barrier layer and the additional thermal barrier layer.

Thus, such confinement allows both an improvement in the breakdown of the separation layer(s) and protection of the structure to be separated and of the substrate.

In one embodiment, the additional thermal barrier layer is produced from a material having a lattice parameter that is between the lattice parameter of the substrate and the lattice parameter of the separation layer(s).

Thus, the additional thermal barrier layer provides a supplementary buffer layer function for adapting the mesh parameters.

In one embodiment, the thermal barrier layer is produced from a material having a lattice parameter that is between the lattice parameter of the structure to be separated and the lattice parameter of the separation layer(s).

Thus, the thermal barrier layer provides a supplementary buffer layer function for adapting the mesh parameters.

According to one form of execution, the substrate comprises GaN, the separation layer(s) comprise $In_{(x)}Ga_{(1-x)}N$, $0.10 \leq x \leq 0.20$, preferably $0.12 \leq x \leq 0.15$, the thermal barrier layer and/or the additional thermal barrier layer comprises AlGaN, and the spectral range of the electromagnetic irradiations is between 400 and 450 nm.

According to another form of execution, the substrate comprises InP, the separation layer(s) comprise $In_{(x)}Ga_{(1-x)}As$, preferably $x<0.95$, more preferably $x=0.53$, the thermal barrier layer and/or the additional thermal barrier layer comprises InAlAs, preferably $In_{0.52}Al_{0.48}As$, and the spectral range of the electromagnetic irradiations is between 1000 and 3500 nm, preferably between 1100 and 1500 nm.

This disclosure likewise relates to a separation assembly comprising:
a separation stack in accordance with the disclosure,
a device designed to expose the separation layer(s) to electromagnetic irradiations via the substrate during an exposure period at a given power density such that the separation layer(s) break down under the effect of the heat stemming from the absorption of the electromagnetic irradiations, the device preferably comprising a laser emitting the electromagnetic irradiations that is associated with an optical parametric oscillator.

Thus, such a laser associated with a parametric oscillator makes it possible to obtain electromagnetic irradiations covering a large spectral range, for example, from 400 nm to 2200 nm, which allows a large choice of materials for the separation layers.

BRIEF DESCRIPTION OF THE DRAWING

Other features and advantages will emerge from the description that follows for two embodiments of a separation stack according to the disclosure, which are provided by way of nonlimiting examples, with reference to the accompanying drawing, in which FIG. 1 is a schematic view of a separation stack in accordance with the disclosure.

DETAILED DESCRIPTION

For the various embodiments, the same references will be used for elements that are identical or that provide the same function, in the interests of simplifying the description.

The separation stack illustrated in FIG. 1 is a stack for separating a structure 1 from a substrate 2 through electromagnetic irradiations EI belonging to a spectral range during an exposure period at a given power density.

The structure 1 to be separated can be transferred to a final substrate following separation. The structure 1 to be separated can comprise at least one active layer. "Active" is understood to mean a layer on which or in which there will be produced components that are intended for applications particularly in the field of microelectronics.

The separation stack comprises:

the substrate 2 that is transparent in the spectral range, a separation layer 3 that is absorbent in the spectral range, and that is likely to break down under the effect of the heat stemming from the absorption of the electromagnetic irradiations EI, the structure 1 to be separated, a thermal barrier layer 4 arranged between the separation layer 3 and the structure 1, an additional thermal barrier layer 5 arranged between the separation layer 3 and the substrate 1, the thermal barrier layer 4 and the additional thermal barrier layer 5 being transparent in the spectral range.

The separation layer 3 can comprise a sublayer that is absorbent in the spectral range and an adjacent sublayer that is likely to break down under the effect of the heat stemming from the absorption of the electromagnetic irradiations EI by the absorbent sublayer. The breakdown of the separation layer 3 may be a thermal breakdown or relaxation of thermomechanical constraints.

The exposure period and the thickness of the thermal barrier layer 4 are adapted such that the temperature of the structure 1 to be separated remains below a threshold during the exposure period, beyond which threshold, faults are likely to appear in structure 1. Equally, the exposure period and the thickness of the additional thermal barrier layer 5 are adapted such that the temperature of the substrate 2 remains below a threshold during the exposure period, beyond which threshold, faults are likely to appear in substrate 2. To this end, when the electromagnetic irradiations EI are electromagnetic pulses, the exposure period and the thickness of the thermal barrier layer 4, which is denoted $E_1$, confirm the following relationship: $E_1 \geq \sqrt{2D_1\tau}$; where $D_1$ is the thermal diffusion coefficient of the thermal barrier layer 4 and $\tau$ is the duration of an electromagnetic pulse. Equally, the exposure period and the thickness of the additional thermal barrier layer 5, which is denoted $E_2$, confirm the following relationship: $E_2 \geq \sqrt{2D_2\tau}$; where $D_2$ is the thermal diffusion coefficient of the additional thermal barrier layer 5 and $\tau$ is the duration of an electromagnetic pulse.

The thermal barrier layer 4 and the additional thermal barrier layer 5 each have a thermal diffusion coefficient $D_1$, $D_2$. The exposure period for the electromagnetic irradiations EI and the thermal diffusion coefficients D1, D2 are adapted such that the heat stemming from the absorption of the electromagnetic irradiations EI by the separation layer 3 is confined between the thermal barrier layer 4 and the additional thermal barrier layer 5. In other words, the length of thermal diffusion in the thermal barrier 4 is short relative to the thickness of the thermal barrier layer 4. In the same way, the length of thermal diffusion in the additional barrier layer 5 is short relative to the thickness of the additional barrier layer 5.

The thermal barrier layer 4 is produced from a material having a lattice parameter that is between the lattice parameter of the structure 1 to be separated and the lattice parameter of the separation layer 3. The additional thermal barrier layer 5 is produced from a material having a lattice parameter that is between the lattice parameter of the substrate 2 and the lattice parameter of the separation layer 3.

The electromagnetic irradiations EI can be emitted by a laser associated with an optical parametric oscillator.

In a first embodiment, the substrate 2 comprises GaN. The separation layer 3 comprises $In_{(x)}Ga_{(1-x)}N$, $0.10 \leq x \leq 0.20$, preferably $0.12 \leq x \leq 0.15$. The thermal barrier layer 4 and the additional thermal barrier layer 5 each comprise AlGaN. Such thermal barrier layers 4, 5 form buffer layers for adapting the mesh parameters.

The spectral range of the electromagnetic irradiations EI is between 400 and 450 nm.

The electromagnetic irradiations EI are electromagnetic pulses that can be emitted by an Nd:YAG laser of Q-switch type emitting at 355 nm, for which the duration of the pulses is 7 ns and the frequency of pulses is 20 Hz. The laser is associated with an optical parametric oscillator covering a spectral range from 400 to 2200 nm. The power density of the laser may be between 1 J·cm$^{-2}$ and 5 J·cm$^{-2}$ in the spectral range between 400 and 450 nm.

In a second embodiment, the separation stack differs from that of the first embodiment in that the substrate 2 comprises InP, in that the separation layer 3 comprises $In_{(x)}Ga_{(1-x)}As$, preferably $x < 0.95$, more preferably $x = 0.53$, in that the thermal barrier layer 4 and the additional thermal barrier layer 5 comprise InAlAs, preferably $In_{0.52}Al_{0.48}As$, and in that the spectral range of the electromagnetic irradiations EI is between 1100 and 1500 nm. The power density of the laser may be between 0.05 J·cm$^{-2}$ and 0.3 J·cm$^{-2}$ in the spectral range between 1100 and 1500 nm.

Of course, the embodiments of the disclosure that are described above do not have any limiting characteristic. Details and improvements can be provided therefor in other execution variants without, however, departing from the scope of the disclosure.

The invention claimed is:

1. A method for separating a structure from a substrate through electromagnetic irradiations belonging to a spectral range, the separation method having the steps of:
   a) providing the substrate, the substrate being transparent in the spectral range,
   b) forming at least one separation layer on the substrate, the spectral range of the electromagnetic irradiations (EI) being adapted such that the separation layer(s) are absorbent in the spectral range,
   c) forming the structure to be separated on the separation layer(s),
   d) exposing the separation layer(s) to the electromagnetic irradiations via the substrate during an exposure period at a given power density such that the separation layer(s) break down under the effect of the heat stemming from the absorption of the electromagnetic irradiations, wherein the separation method being comprises a step b1) of forming a thermal barrier layer on the separation layer(s), the spectral range of the electromagnetic irradiations being adapted such that the thermal barrier layer is transparent in the spectral range, the exposure period and the thickness of the thermal barrier layer being adapted such that the temperature of the structure to be separated remains below a threshold temperature during the exposure period, beyond which threshold temperature, faults are likely to appear in the structure, step c) being executed such that the structure to be separated is formed on the thermal barrier layer.

2. The separation method according to claim 1, wherein the electromagnetic irradiations are electromagnetic pulses, and wherein the exposure period and the thickness of the thermal barrier layer, which is denoted $E_1$, have the following relationship: $E_1 \leq \sqrt{2D_1\tau}$; where $D_1$ is the thermal diffusion coefficient of the thermal barrier layer and $\tau$ is the duration of an electromagnetic pulse of the electromagnetic pulses.

3. The separation method according to claim 1, wherein the separation method further comprises a step a1) of forming an additional thermal barrier layer on the substrate, the spectral range of the electromagnetic irradiations being adapted such that the additional thermal barrier layer is transparent in the spectral range, the exposure period and the thickness of the additional thermal barrier layer being adapted such that the temperature of the substrate remains below a threshold temperature during the exposure period, beyond which threshold temperature, faults are likely to appear in the substrate, and wherein step b) is executed such that the separation layer(s) are formed on the additional thermal barrier layer.

4. The separation method according to claim 3, wherein the electromagnetic irradiations are electromagnetic pulses, and wherein the exposure period and the thickness of the additional thermal barrier layer, which is denoted $E_2$, have the following relationship: $E_2 \geq \sqrt{2D_2\tau}$; where $D_2$ is the thermal diffusion coefficient of the additional thermal barrier layer and $\tau$ is the duration of an electromagnetic pulse of the electromagnetic pulses.

5. The separation method according to claim 3, wherein the thermal barrier layer and the additional thermal barrier layer each have a thermal diffusion coefficient, and wherein the exposure period for the electromagnetic irradiations and the thermal diffusion coefficients are adapted such that the heat stemming from the absorption of the electromagnetic irradiations by the separation layer(s) is confined between the thermal barrier layer and the additional thermal barrier layer.

6. The separation method according to claim 3, wherein the additional thermal barrier layer is comprises a material having a lattice parameter between the lattice parameter of the substrate and the lattice parameter of the separation layer(s).

7. The separation method according to claim 1, wherein the thermal barrier layer comprises a material having a lattice parameter between the lattice parameter of the structure to be separated and the lattice parameter of the separation layer(s).

8. The separation method according to claim 1, wherein the substrate comprises GaN, the separation layer(s) comprise $In_{(x)}Ga_{(1-x)}N$, wherein $0.10 \leq x \leq 0.20$, and the thermal barrier layer and/or the additional thermal barrier layer comprises AlGaN, and the spectral range of the electromagnetic irradiations is between 400 and 450 nm.

9. The separation method according to claim 1, wherein the substrate comprises InP, the separation layer(s) comprise $In_{(x)}Ga_{(1-x)}As$, the thermal barrier layer and/or the additional thermal barrier layer comprises InAlAs, and the spectral range of the electromagnetic irradiations is between 1000 and 3500 nm.

10. The separation method according to claim 1, wherein step d) is executed by means of at least one laser emitting the electromagnetic irradiations that is associated with an optical parametric oscillator.

11. A stack for separating a structure from a substrate through electromagnetic irradiations belonging to a spectral range during an exposure period at a given power density, the separation stack comprising:

the substrate, wherein the substrate is transparent in the spectral range, at least one separation layer disposed on the substrate, wherein the separation layer(s) being absorbent in the spectral range, the separation layer(s) being likely to break down under the effect of the heat stemming from the absorption of the electromagnetic irradiations, and the structure to be separated disposed on the separation layer(s), wherein the separation stack it comprises a thermal barrier layer disposed between the separation layer(s) and the structure to be separated, and wherein the thermal barrier layer is transparent in the spectral range, the thermal barrier layer having a thickness that is adapted to the exposure period such that the temperature of the structure to be separated remains below a threshold temperature during the exposure period, beyond which threshold temperature, faults are likely to appear in said structure.

12. The separation stack according to claim 11, wherein the electromagnetic irradiations are electromagnetic pulses, and wherein the thickness of the thermal barrier layer, which is denoted $E_1$, has the following relationship: $E_1 \geq \sqrt{2D_1\tau}$; where $D_1$ is the thermal diffusion coefficient of the thermal barrier layer and $\tau$ is the duration of an electromagnetic pulse of the electromagnetic pulses.

13. The separation stack according to claim 11, wherein the separation stack comprises an additional thermal barrier layer disposed between the separation layer(s) and the substrate, the additional barrier layer being transparent in the spectral range, the additional thermal barrier layer having a thickness that is adapted to the exposure period such that the temperature of the substrate remains below a threshold temperature during the exposure period, beyond which threshold temperature, faults are likely to appear in the substrate.

14. The separation stack according to claim 13, wherein the electromagnetic irradiations are electromagnetic pulses, and the thickness of the additional thermal barrier layer, which is denoted $E_2$, has the following relationship: $E_2 \geq \sqrt{2D_2\tau}$; where $D_2$ is the thermal diffusion coefficient of the additional thermal barrier layer and $\tau$ is the duration of an electromagnetic pulse of the electromagnetic pulses.

15. The separation stack according to claim 13, wherein the thermal barrier layer and the additional thermal barrier layer each have a thermal diffusion coefficient, and the thermal diffusion coefficients are adapted relative to the exposure period for the electromagnetic irradiations such that the heat stemming from the absorption of the electromagnetic irradiations by the separation layer(s) is confined between the thermal barrier layer and the additional thermal barrier layer.

16. The separation stack according to claim 13, wherein the additional thermal barrier layer comprises a material having a lattice parameter that is between the lattice parameter of the substrate and the lattice parameter of the separation layer(s).

17. The separation stack according to claim 11, wherein the thermal barrier layer comprises a material having a lattice parameter between the lattice parameter of the structure to be separated and the lattice parameter of the separation layer(s).

18. The separation stack according to claim 11, wherein the substrate comprises GaN, the separation layer(s) comprise $In_{(x)}Ga_{(1-x)}N$, wherein $0.10 \leq x \leq 0.20$, the thermal barrier layer and/or the additional thermal barrier layer comprises AlGaN, and the spectral range of the electromagnetic irradiations is between 400 and 450 nm.

19. The separation stack according to claim 11, wherein the substrate comprises InP, the separation layer(s) comprise $In_{(x)}Ga_{(1-x)}As$, the thermal barrier layer and/or the additional thermal barrier layer comprises InAlAs, and the spectral range of the electromagnetic irradiations is between 1000 and 3500 nm.

20. A separation assembly comprising:
a separation stack according to claim 11,
a device located and configured to expose the separation layer(s) to electromagnetic irradiations via the substrate during an exposure period at a given power density such that the separation layer(s) break down under the effect of the heat stemming from the absorption of the electromagnetic irradiations.

\* \* \* \* \*

UNITED STATES PATENT AND TRADEMARK OFFICE
CERTIFICATE OF CORRECTION

PATENT NO. : 9,679,777 B2
APPLICATION NO. : 14/909969
DATED : June 13, 2017
INVENTOR(S) : Yann Sinquin, Jean-Marc Bethoux and Oleg Kononchuk Page 1 of 1

It is certified that error appears in the above-identified patent and that said Letters Patent is hereby corrected as shown below:

In the Claims

| | | | |
|---|---|---|---|
| Claim 1, | Column 8, | Line 46, | change "separation method being" to --separation method-- |
| Claim 6, | Column 9, | Line 31, | change "layer is comprises" to --layer comprises-- |
| Claim 11, | Column 10, | Line 2, | change "stack it comprises" to --stack comprises-- |

Signed and Sealed this
Eighth Day of May, 2018

Andrei Iancu
*Director of the United States Patent and Trademark Office*